(12) United States Patent
Luan et al.

(10) Patent No.: US 12,183,581 B2
(45) Date of Patent: *Dec. 31, 2024

(54) METHOD OF FORMING A SEMICONDUCTOR DEVICE BY DRIVING HYDROGEN INTO A DIELECTRIC LAYER FROM ANOTHER DIELECTRIC LAYER

(71) Applicant: Taiwan Semiconductor Manufacturing Co., Ltd., Hsinchu (TW)

(72) Inventors: Hongfa Luan, Baoshan (TW); Yi-Fan Chen, New Taipei (TW); Chun-Yen Peng, Hsinchu (TW); Cheng-Po Chau, Tainan (TW); Wen-Yu Ku, Hsinchu (TW); Huicheng Chang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/358,609

(22) Filed: Jul. 25, 2023

(65) Prior Publication Data

US 2023/0386847 A1 Nov. 30, 2023

Related U.S. Application Data

(60) Continuation of application No. 17/201,073, filed on Mar. 15, 2021, now Pat. No. 11,776,814, which is a (Continued)

(51) Int. Cl.
*H01L 21/28* (2006.01)
*H01L 21/225* (2006.01)
(Continued)

(52) U.S. Cl.
CPC .... *H01L 21/28185* (2013.01); *H01L 21/2254* (2013.01); *H01L 21/28176* (2013.01);
(Continued)

(58) Field of Classification Search
CPC ........... H01L 21/28185; H01L 21/2254; H01L 21/28176; H01L 21/30604;
(Continued)

(56) References Cited

U.S. PATENT DOCUMENTS

| 4,151,007 A | 4/1979 | Levinstein et al. |
| 5,872,387 A | 2/1999 | Lyding et al. |

(Continued)

FOREIGN PATENT DOCUMENTS

| CN | 102486999 A | 6/2012 |
| JP | 2016058658 A | 4/2016 |

OTHER PUBLICATIONS

M. Dai et al., "Effect of plasma N2 and thermal NH3 nitridation in HfO2 for ultrathin equivalent oxide thickness" Journal of Applied Physics 113, 044103, 2013, 7 pages.

(Continued)

*Primary Examiner* — Lex H Malsawma
(74) *Attorney, Agent, or Firm* — Slater Matsil, LLP

(57) ABSTRACT

Embodiment described herein provide a thermal treatment process following a high-pressure anneal process to keep hydrogen at an interface between a channel region and a gate dielectric layer in a field effect transistor while removing hydrogen from the bulk portion of the gate dielectric layer. The thermal treatment process can reduce the amount of threshold voltage shift caused by a high-pressure anneal. The high-pressure anneal and the thermal treatment process may be performed any time after formation of the gate dielectric layer, thus, causing no disruption to the existing process flow.

20 Claims, 11 Drawing Sheets

Related U.S. Application Data continuation of application No. 16/907,889, filed on Jun. 22, 2020, now Pat. No. 10,950,447, which is a continuation of application No. 16/568,585, filed on Sep. 12, 2019, now Pat. No. 10,714,348, which is a division of application No. 15/952,714, filed on Apr. 13, 2018, now Pat. No. 10,504,735.

(60) Provisional application No. 62/565,890, filed on Sep. 29, 2017.

(51) Int. Cl.
| | | |
|---|---|---|
| *H01L 21/306* | (2006.01) | |
| *H01L 21/3105* | (2006.01) | |
| *H01L 21/8234* | (2006.01) | |
| *H01L 29/08* | (2006.01) | |
| *H01L 29/40* | (2006.01) | |
| *H01L 29/423* | (2006.01) | |
| *H01L 29/51* | (2006.01) | |
| *H01L 29/66* | (2006.01) | |
| *H01L 29/78* | (2006.01) | |
| *H01L 29/417* | (2006.01) | |

(52) U.S. Cl.
CPC .. *H01L 21/30604* (2013.01); *H01L 21/31053* (2013.01); *H01L 21/823418* (2013.01); *H01L 21/823431* (2013.01); *H01L 21/823437* (2013.01); *H01L 21/823462* (2013.01); *H01L 21/823468* (2013.01); *H01L 29/0847* (2013.01); *H01L 29/401* (2013.01); *H01L 29/42364* (2013.01); *H01L 29/517* (2013.01); *H01L 29/66477* (2013.01); *H01L 29/66545* (2013.01); *H01L 29/66636* (2013.01); *H01L 29/66795* (2013.01); *H01L 29/785* (2013.01); *H01L 29/7851* (2013.01); *H01L 29/41791* (2013.01); *H01L 29/513* (2013.01)

(58) Field of Classification Search
CPC ....... H01L 21/31053; H01L 21/823418; H01L 21/823431; H01L 21/823437; H01L 21/823462; H01L 21/823568; H01L 29/0847; H01L 29/401; H01L 29/42364; H01L 29/517; H01L 29/66477; H01L 29/66545; H01L 29/66636; H01L 29/66795; H01L 29/785; H01L 29/7851; H01L 29/41791; H01L 29/513
See application file for complete search history.

(56) References Cited

U.S. PATENT DOCUMENTS

| | | |
|---|---|---|
| 6,071,751 A | 6/2000 | Wallace et al. |
| 6,274,490 B1 | 8/2001 | Chyan et al. |
| 6,576,522 B2 | 6/2003 | Chetlur et al. |
| 6,913,961 B2 | 7/2005 | Hwang |
| 8,445,969 B2 | 5/2013 | Chen et al. |
| 9,755,064 B2 | 9/2017 | Ohashi et al. |
| 10,504,735 B2 * | 12/2019 | Luan .................. H01L 29/0847 |
| 10,714,348 B2 | 7/2020 | Luan et al. |
| 10,950,447 B2 | 3/2021 | Luan et al. |
| 11,776,814 B2 * | 10/2023 | Luan ............... H01L 21/823418 |
| | | 257/411 |
| 2002/0031920 A1 | 3/2002 | Lyding et al. |
| 2004/0266117 A1 | 12/2004 | Hwang |
| 2008/0026553 A1 | 1/2008 | Chua et al. |
| 2009/0148965 A1 | 6/2009 | Kim et al. |
| 2012/0273894 A1 | 11/2012 | Chen et al. |
| 2015/0236121 A1 | 8/2015 | Chiu et al. |
| 2015/0380253 A1 | 12/2015 | Lee et al. |
| 2016/0087045 A1 | 3/2016 | Shimizu |
| 2016/0247907 A1 * | 8/2016 | Ohashi ................ H01L 29/7802 |
| 2016/0284804 A1 | 9/2016 | Shimizu et al. |
| 2017/0011932 A1 | 1/2017 | Pethe et al. |
| 2018/0076241 A1 | 3/2018 | Takechi |

OTHER PUBLICATIONS

C.H. Lee et al., "Ge MOSFETs Performance: Impact of Ge Interface Passivation" IEEE International Electron Devices Meeting 2010, 4 pages.

C.H. Lee et al, "Reconsideration of Electron Mobility in Ge n-MOSFETs from Ge Substrate Side" IEEE International Electron Devices Meeting 2013, 4 pages.

M. Sato et al., "Impact of Activation Annealing Temperature on the Performance, Negative Bias Temperature Instability, and Time-to-Dielectric Breakdown Lifetime on High-k/Metal Gate Stack p-Type Metal-Oxide-Semiconductor Field Effect Transistors" Japanese Journal of Applied Physics, 48, 2009, 04C002, 6 pages.

* cited by examiner

METHOD OF FORMING A SEMICONDUCTOR DEVICE BY DRIVING HYDROGEN INTO A DIELECTRIC LAYER FROM ANOTHER DIELECTRIC LAYER

CROSS-REFERENCE TO RELATED APPLICATIONS

This application is a continuation of U.S. patent application Ser. No. 17/201,073, filed on Mar. 15, 2021, now U.S. Pat. No. 11,776,814 issued Oct. 3, 2023, entitled "Method of Forming a Semiconductor Device by Driving Hydrogen into a Dielectric Layer from Another Dielectric Layer," which is a continuation of U.S. patent application Ser. No. 16/907,889, filed on Jun. 22, 2020, entitled "Semiconductor Device Having Hydrogen in a Dielectric Layer," now U.S. Pat. No. 10,950,447 issued Mar. 16, 2021, which is a continuation of U.S. patent application Ser. No. 16/568,585, filed on Sep. 12, 2019, entitled "Semiconductor Device Having Hydrogen in a Dielectric Layer," now U.S. Pat. No. 10,714,348 issued Jul. 14, 2020, which is a divisional of U.S. patent application Ser. No. 15/952,714, filed on Apr. 13, 2018, entitled "Method of Forming a Semiconductor Device by High-Pressure Anneal and Post-Anneal Treatment," now U.S. Pat. No. 10,504,735 issued Dec. 10, 2019, which claims priority to U.S. Provisional Patent Application No. 62/565,890, filed on Sep. 29, 2017, which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. However, with the decreasing in scaling, new challenges are presented.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
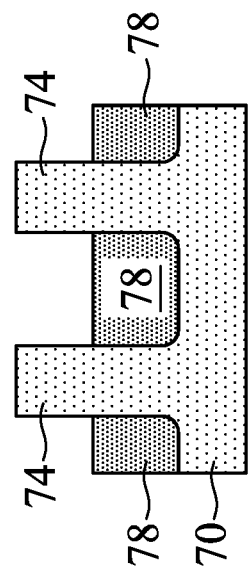
FIGS. 1A-C, 2A-B, 3A-B, 4A-B, 5A-B, 6A-B, 7A-B, and 8A-B are various views of respective intermediate structures at intermediate stages in an example process of forming a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. The term "hydrogen" may include hydrogen (H), deuterium (D), and other isotopes of hydrogen.

Methods of forming a semiconductor device, such as including a Fin Field-Effect Transistor (FinFET), are described herein, along with structures formed by the methods. Particularly, an embodiment of the present disclosure provides a method for improving FinFET performance through a high-pressure anneal process and a post-anneal treatment process for threshold voltage recovery.

Example embodiments described herein are described in the context of forming gate structures on FinFETs. Implementations of some aspects of the present disclosure may be used in other processes, in other devices, and/or for other layers. For example, other example devices can include planar FETs, Horizontal Gate All Around (HGAA) FETs, Vertical Gate All Around (VGAA) FETs, and other devices. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

FIGS. 1A-C through 8A-B are views of respective intermediate structures at intermediate stages in an example process of forming a semiconductor device in accordance with some embodiments. Particularly, FIGS. 1A-C through 8A-B describe stages of forming FinFET structures with a replacement gate process.

Figure 1A:
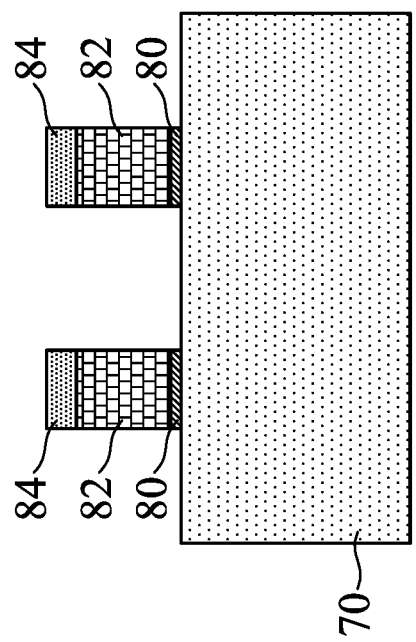
Figure 1C:
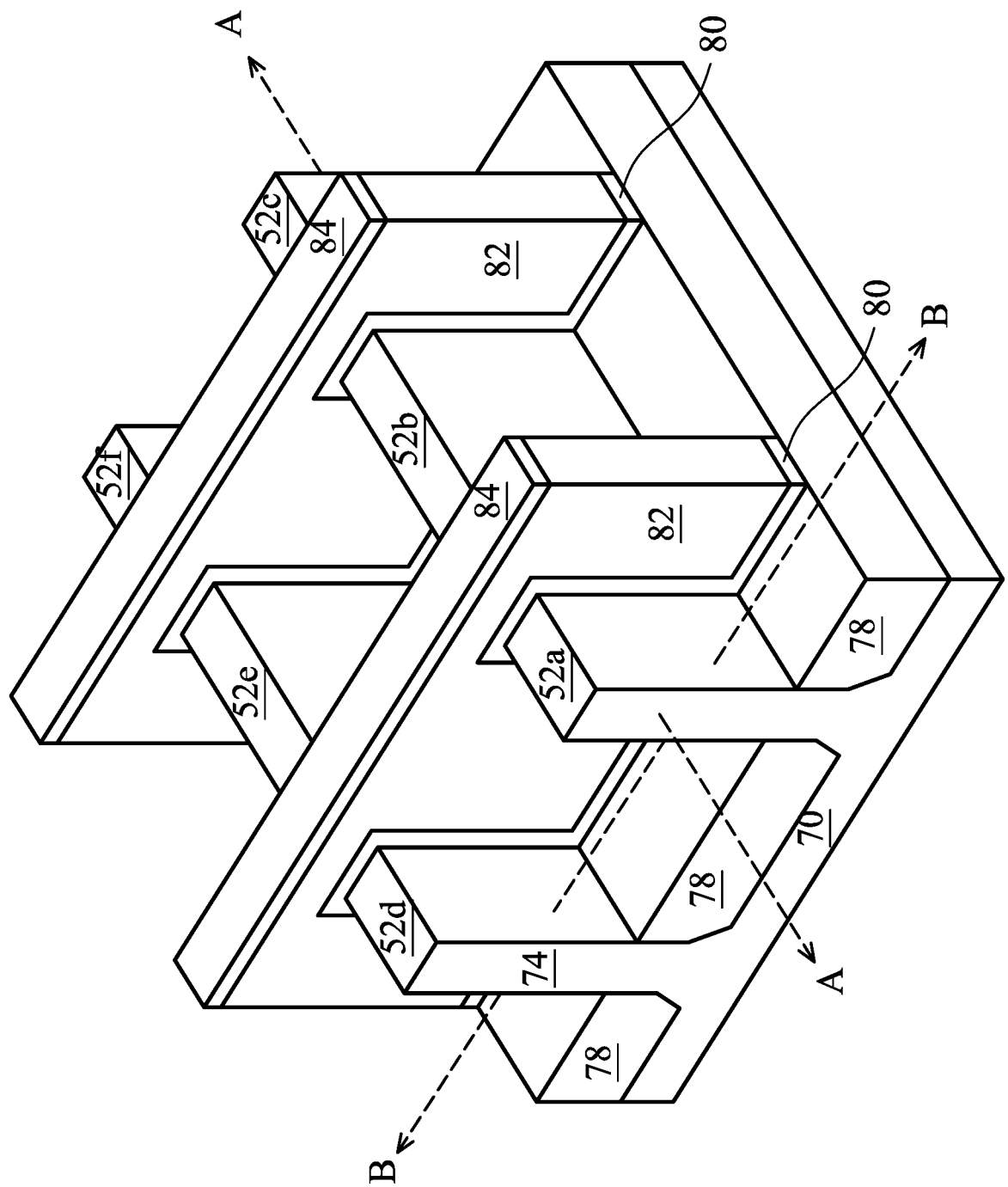

FIGS. 1A, 1B, and 1C illustrate different views of an intermediate structure at a stage in an example process of forming a semiconductor device in accordance with some embodiments. FIGS. 1A and 1B are different cross-sectional views of the intermediate structure, and FIG. 1C is a perspective view of the intermediate structure.

Fins 74 are on a semiconductor substrate 70. Isolation regions 78 are on the semiconductor substrate 70 and are disposed between neighboring fins 74. The fins 74 each protrude above and from between neighboring isolation regions 78. Gate stacks (or more generically, gate structures), with each including an interfacial dielectric 80, a dummy gate layer 82, and a mask 84, are formed along sidewalls and over top surfaces of the fins 74. Source/drain regions 52a-f are disposed in respective regions of the fins 74.

FIG. 1C further illustrates reference cross-sections that are used in other figures. Cross-section A-A is in a plane along, e.g., channels in one fin 74 between opposing source/drain regions 52a-c. Cross-section B-B is in a plane perpendicular to cross-section A-A and is across source/drain region 52a and source/drain region 52d in neighboring fins 74. The figures ending with an "A" designation illustrate cross-sectional views at various instances of processing corresponding to cross-section A-A, and the figures ending with a "B" designation illustrate cross-sectional views at various instances of processing corresponding to cross-section B-B. In some figures, some reference numbers of components or features illustrated therein may be omitted to avoid obscuring other components or features; this is for ease of depicting the figures.

The semiconductor substrate 70 may be or include a bulk semiconductor substrate, a semiconductor-on-insulator (SOI) substrate, or the like, which may be doped (e.g., with a p-type or an n-type dopant) or undoped. The semiconductor material of the semiconductor substrate 70 may include an elemental semiconductor including silicon (Si) or germanium (Ge); a compound semiconductor; an alloy semiconductor; or a combination thereof.

The fins 74 may be formed from the semiconductor substrate 70, such as by etching trenches between the fins 74. The isolation regions 78 may be formed in the trenches between the fins 74. The isolation regions 78 may include or be an insulating material such as an oxide (such as silicon oxide), a nitride, the like, or a combination thereof. The fins 74 protrude from between neighboring isolation regions 78, which may, at least in part, thereby delineate the fins 74 as active areas on the semiconductor substrate 70. The fins 74 and isolation regions 78 may be formed by any acceptable processes and can include any acceptable material. In some examples, the fins 74 may include heteroepitaxial structures (e.g., a material lattice-mismatched to the semiconductor material of the semiconductor substrate 70) or other structures.

The gate stacks are over and extend laterally perpendicularly to the fins 74. The interfacial dielectric 80, dummy gate layer 82, and mask 84 for the gate stacks may be formed by sequentially forming respective layers, and then patterning those layers into the gate stacks. The interfacial dielectric 80 may include or be silicon oxide, silicon nitride, the like, or multilayers thereof. The dummy gate layer 82 may include or be silicon (e.g., polysilicon) or another material. The mask 84 may include or be silicon nitride, silicon oxynitride, silicon carbon nitride, the like, or a combination thereof. The layers for the interfacial dielectrics 80, dummy gate layers 82, and masks 84 may deposited and then patterned using any acceptable processes to form the mask 84, dummy gate layer 82, and interfacial dielectric 80 for each gate stack.

Figure 2B:
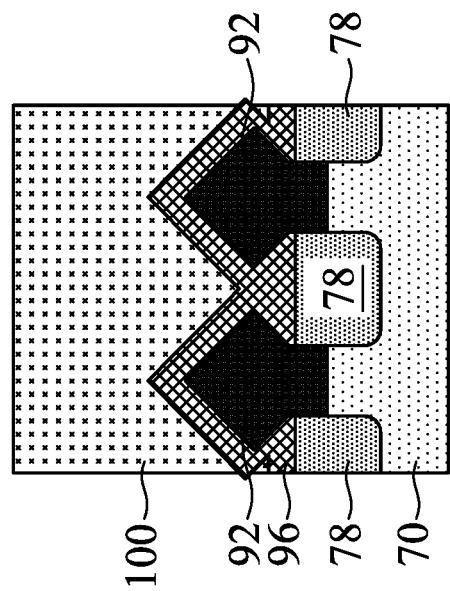
Figure 2A:
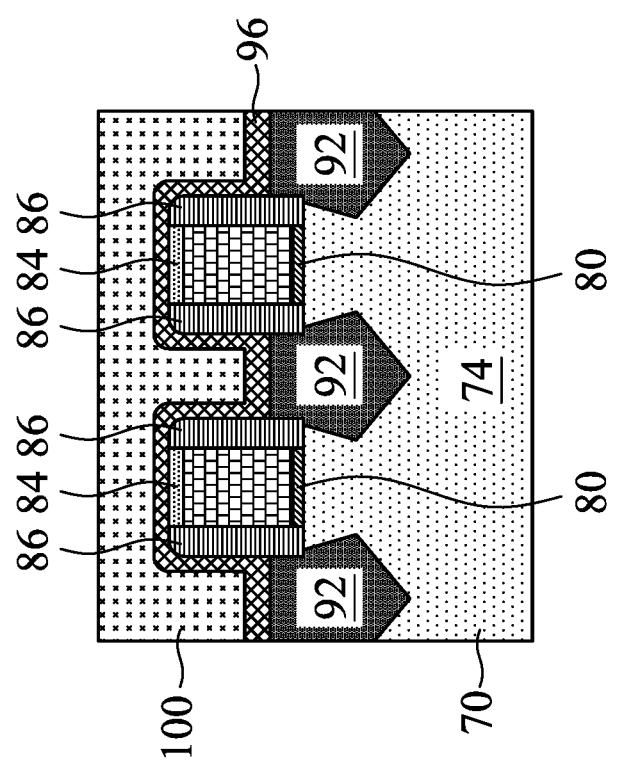

FIGS. 2A and 2B illustrate the formation of gate spacers 86 along the gate stacks, epitaxy source/drain regions 92 in the fins 74, a contact etch stop layer (CESL) 96 over various components, and a first interlayer dielectric (ILD) 100 over the CESL 96. Gate spacers 86 are formed along sidewalls of the gate stacks (e.g., sidewalls of the interfacial dielectric 80, dummy gate layer 82, and mask 84) and over the fins 74. Residual gate spacers 86 may remain along sidewalls of the fins 74, for example, depending on the height of the fins 74 above the isolation regions 78. The gate spacers 86 may be formed by conformally depositing one or more layers for the gate spacers 86 and anisotropically etching the one or more layers, for example. The one or more layers for the gate spacers 86 may include or be silicon oxycarbide, silicon nitride, silicon oxynitride, silicon carbon nitride, the like, multi-layers thereof, or a combination thereof.

After forming the gate spacers 86, recesses are formed in the fins 74 using the gate stacks and gate spacers 86 as masks, and epitaxy source/drain regions 92 are epitaxially grown in the recesses. The recesses, and hence, the epitaxy source/drain regions 92, are formed in the fins 74 on opposing sides of the gate stacks. The recessing can be by an etch process, and due to the nature of the etch process, the recesses can have various cross-sectional profiles. The epitaxy source/drain regions 92 may include or be silicon germanium, silicon carbide, silicon phosphorus, pure or substantially pure germanium, a III-V compound semiconductor, a II-VI compound semiconductor, or the like. The epitaxy source/drain regions 92 may extend beyond sidewalls and top surfaces of the fins 74 (e.g., are raised) and may have facets, which may correspond to crystalline planes of the semiconductor substrate 70.

A person having ordinary skill in the art will also readily understand that the recessing and epitaxial growth of source/drain regions 92 may be omitted, and that source/drain regions may be formed by implanting dopants into the fins 74 using the gate stacks and gate spacers 86 as masks. In some examples where epitaxy source/drain regions 92 are implemented, the epitaxy source/drain regions 92 may also be doped, such as by in-situ doping during epitaxial growth and/or by implanting dopants into the epitaxy source/drain regions 92 after epitaxial growth. Hence, a source/drain region may be delineated by doping (e.g., by implantation and/or in situ during epitaxial growth, if appropriate) and/or by epitaxial growth, if appropriate, which may further delineate the active area in which the source/drain region is delineated.

The CESL 96 is conformally deposited on surfaces of the epitaxy source/drain regions 92, sidewalls and top surfaces of the gate spacers 86, top surfaces of the mask 84, and top surfaces of the isolation regions 78. Generally, an etch stop layer can provide a mechanism to stop an etch process when forming, e.g., contacts or vias. An etch stop layer may be formed of a dielectric material having a different etch selectivity from adjacent layers or components. The CESL 96 may comprise or be silicon nitride, silicon carbon nitride, carbon nitride, the like, or a combination thereof. The first ILD 100 is then deposited over the CESL 96. The first ILD 100 may comprise or be silicon dioxide, a low-k dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof.

Figure 3B:
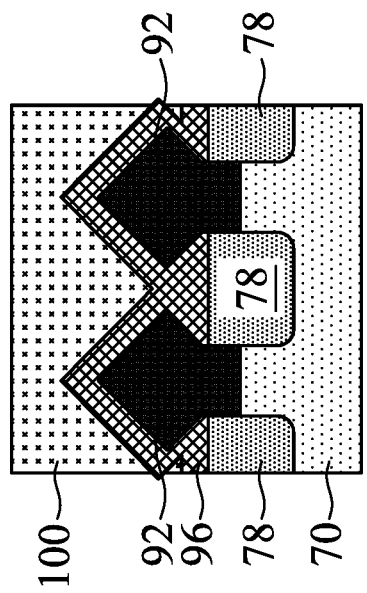
Figure 3A:
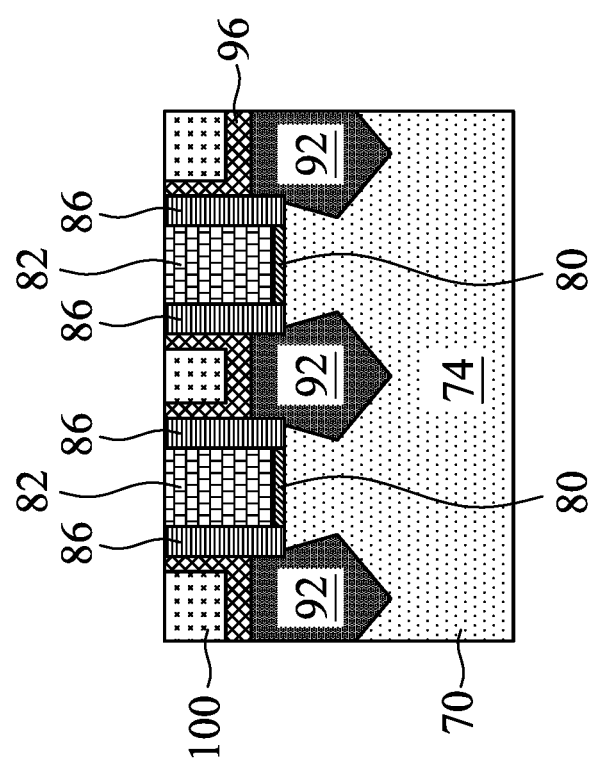

FIGS. 3A and 3B illustrate the removal of portions of the first ILD 100, portions of the CESL 96 layer, and the mask 84 to expose the dummy gate layer 82. The first ILD 100 and CESL 96 are formed with top surfaces coplanar with top surfaces of the dummy gate layers 82. A planarization process, such as a CMP, may be performed to level the top surface of the first ILD 100 and CESL 96 with the top surfaces of the dummy gate layers 82. The CMP may also remove the mask 84 (and, in some instances, upper portions of the gate spacers 86) on the dummy gate layers 82. Accordingly, top surfaces of the dummy gate layers 82 are exposed through the first ILD 100 and the CESL 96.

Figure 4B:
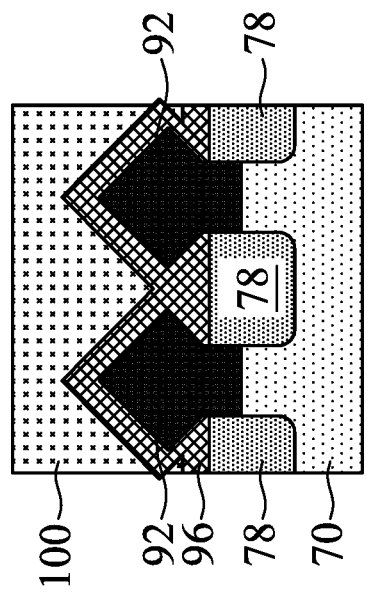
Figure 4A:
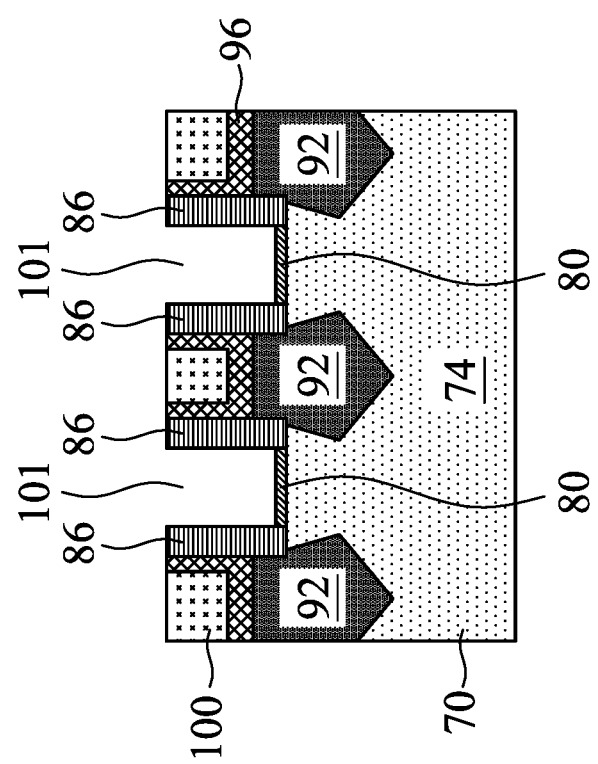

FIGS. 4A and 4B illustrate, after the dummy gate layers 82 have been exposed through the first ILD 100 and the CESL 96, the removal of the dummy gate layers 82, such as by one or more etch processes. The dummy gate layers 82 may be removed by an etch process selective to the dummy gate layers 82, wherein the interfacial dielectrics 80 act as etch stop layers. Recesses 101 are formed between the gate spacers 86.

In some examples, the interfacial dielectrics 80 can be removed by an etch process selective to the interfacial dielectrics 80, and channel regions of the fins 74 are exposed through the recesses 101. Another replacement interfacial dielectric 80 may subsequently be formed in the recesses 101 over the channel regions of the fins 74. In some embodiments, the replacement interfacial dielectric 80 may be a native oxide, such as silicon oxide, formed over the fins 74. In some embodiments, the replacement interfacial dielectric 80 may include or be silicon oxide, silicon nitride, the like, or multilayers thereof, and may be thermally and/or chemically grown on the fins 74, or conformally deposited, such as by PECVD, ALD, or another deposition technique.

In some examples, the interfacial dielectrics 80 are not removed and remain so that respective replacement gate structures are formed on the interfacial dielectrics 80, as described subsequently. Subsequent description may refer to an interfacial dielectric 80, which may apply to the interfacial dielectrics 80 formed as described with respect to FIGS. 1A-C and/or to the replacement interfacial dielectric 80 described above.

Figure 5B:
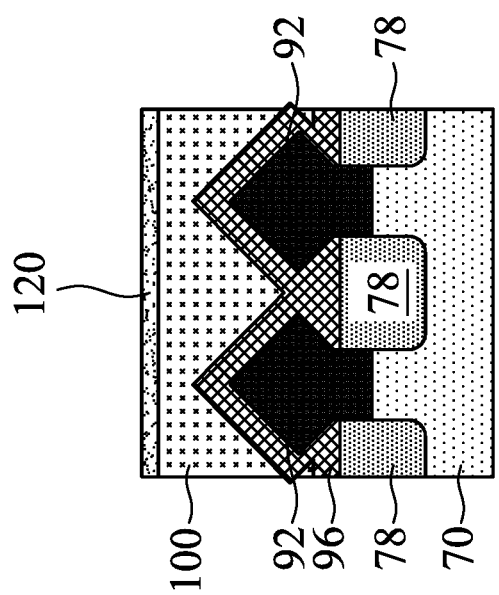
Figure 5A:
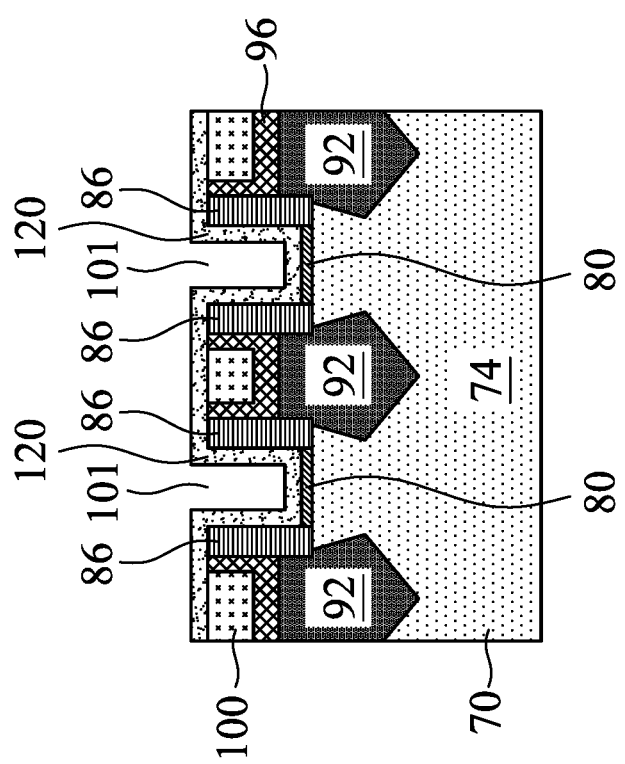

FIGS. 5A and 5B illustrate a gate dielectric layer 120 formed in the recesses 101. The gate dielectric layer 120 can be conformally deposited in the recesses 101 where gate stacks were removed (e.g., on top surfaces of the isolation regions 78, sidewalls and top surfaces of the interfacial dielectric 80 over the fins 74 along the channel regions, and sidewalls of the gate spacers 86) and on the top surfaces of the first ILD 100, the CESL 96, and gate spacers 86. The gate dielectric layer 120 can be or include silicon oxide ($SiO_2$), silicon oxynitride (SiON), silicon nitride (SiN), a high-k dielectric material, multilayers thereof, or other dielectric material. A high-k dielectric material may have a k value greater than about 7.0. The high-k dielectric material may include a metal oxide of or a metal silicate of Hf, Al, Zr, La, Mg, Ba, Ti, Pb, or a combination thereof. The gate dielectric layer 120 can be deposited by ALD, PECVD, MBD, or another deposition technique. In some embodiments, the gate dielectric layer 120 may include a high-k dielectric layer formed immediately over the interfacial dielectric 80 over the channel regions of the fin 74.

After forming the gate dielectric layer 120, an anneal process and/or a post-anneal treatment process can be performed. The anneal process and/or post-anneal treatment process can be performed immediately after forming the gate dielectric layer 120 and/or after any process subsequent to forming the gate dielectric layer 120. Additional details of example anneal process and post-anneal treatment process are described further below.

Then, if implemented, one or more conformal layers 121 may be conformally deposited on the gate dielectric layer 120. The one or more conformal layers 121 can include any combination of one or more barrier layer, capping layer, and work-function tuning layer. Each implemented conformal layer 121 may be conformally deposited on the gate dielectric layer 120 or preceding conformal layer 121, where appropriate. The barrier layer, capping layer, and work-function tuning layer may each include or be tantalum, tantalum nitride, titanium, titanium nitride, the like, or a combination thereof, and may be deposited by ALD, PECVD, MBD, or another deposition technique.

A conductive fill material 122 is formed over the one or more conformal layers 121, if implemented, or the gate dielectric layer 120. Conductive fill material 122 can fill remaining recesses 101 where the gate stacks were removed. Conductive fill material 122 may be or comprise a metal-containing material such as Co, Ru, Al, W, Cu, multi-layers thereof, or a combination thereof. The conductive fill material 122 can be deposited by ALD, PECVD, MBD, PVD, or another deposition technique.

Figure 6B:
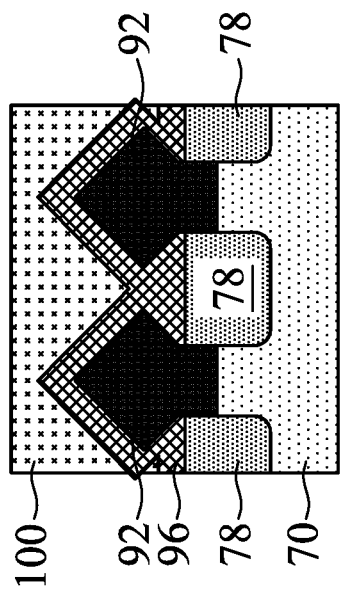
Figure 6A:
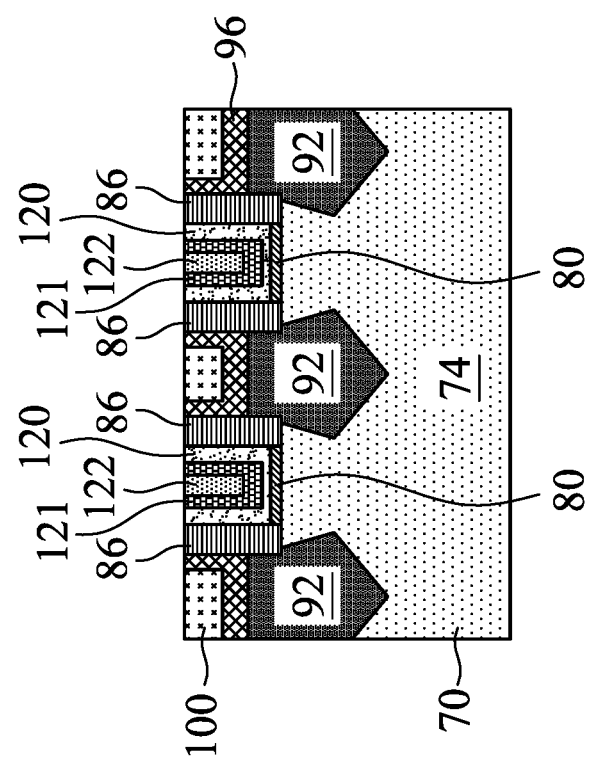

Excess conductive fill material 122, one or more conformal layers 121, and gate dielectric layer 120 above the top surfaces of the first ILD 100, the CESL 96, and gate spacers 86 are removed by a planarization process, like a CMP. The replacement gate structures each comprising a gate dielectric layer 120 and a gate electrode, where the gate electrode is considered to include the conductive fill material 122 and one or more conformal layers 121, may therefore be formed as illustrated in FIGS. 6A and 6B.

A second ILD 130 is formed over the first ILD 100, replacement gate structures, gate spacers 86, and CESL 96. Although not illustrated, in some examples, an etch stop layer (ESL) may be deposited over the first ILD 100, etc., and the second ILD 130 may be deposited over the ESL. If implemented, the etch stop layer may comprise or be silicon nitride, silicon carbon nitride, silicon carbon oxide, carbon nitride, the like, or a combination thereof, and may be deposited by CVD, PECVD, ALD, or another deposition technique. The second ILD 130 may comprise or be silicon dioxide, a low-k dielectric material, such as silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof. The second ILD 130 may be deposited by spin-on, CVD, FCVD, PECVD, PVD, or another deposition technique.

Figure 7B:
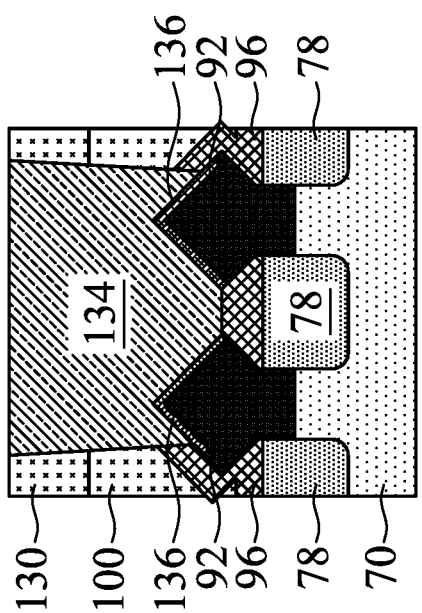
Figure 7A:
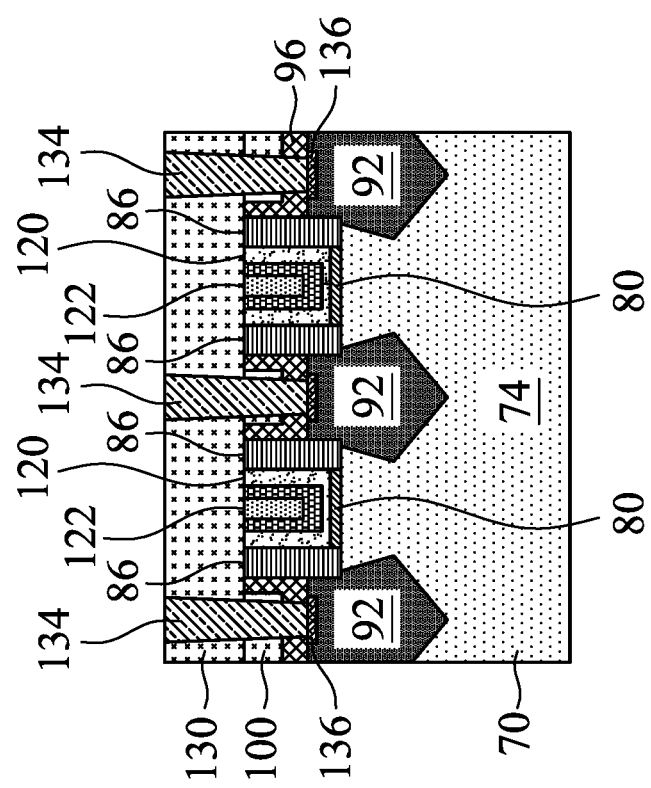

As shown in FIGS. 7A and 7B, conductive features 134 are formed through the second ILD 130 and first ILD 100 to the epitaxy source/drain regions 92. The conductive features 134 may include an adhesion and/or barrier layer and conductive material on the adhesion and/or barrier layer, for example. In some examples, the conductive features 134 may include silicide regions 136 on the epitaxy source/drain regions 92, as illustrated. The adhesion and/or barrier layer can be conformally deposited in openings exposing the epitaxy source/drain regions 92 and over the second ILD 130. The adhesion and/or barrier layer may be or comprise titanium, titanium nitride, titanium oxide, tantalum, tantalum nitride, tantalum oxide, the like, or a combination thereof, and may be deposited by ALD, CVD, or another deposition technique. Silicide regions 136 may be formed on upper portions of the epitaxy source/drain regions 92 by reacting upper portions of the epitaxy source/drain regions 92 with the adhesion and/or barrier layer. An anneal can be performed to facilitate the reaction of the epitaxy source/drain regions 92 with the adhesion and/or barrier layer. The conductive material can be deposited on the adhesion and/or barrier layer and fill the openings. The conductive material may be or comprise tungsten, copper, aluminum, gold, silver, alloys thereof, the like, or a combination thereof, and may be deposited by CVD, ALD, PVD, or another deposition technique. After the material of the conductive features 134 is deposited, excess material may be removed by using a planarization process, such as a CMP, for example, such that top surfaces of the conductive features 134 and the second ILD 130 may be coplanar. The conductive features 134 may be or may be referred to as contacts, plugs, etc.

Figure 8B:
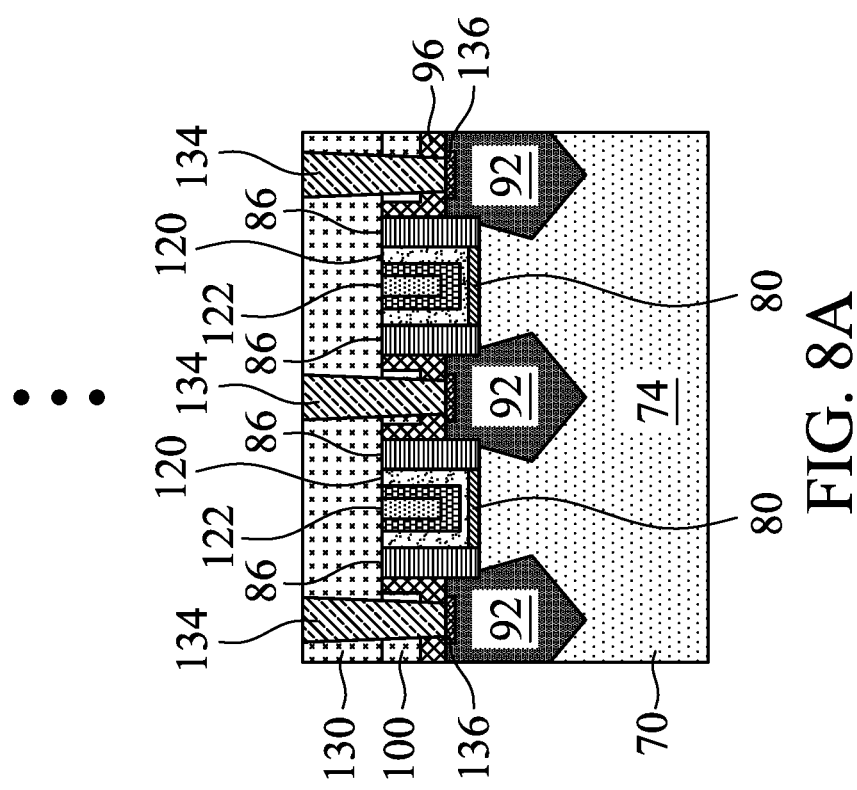
Figure 8A:

Additional conductive features are subsequently formed within multiple intermetallization dielectric (IMD) layers to implement electrical connections for the devices. For example, twelve IMD layers may be formed over transistors in a SRAM device. FIGS. 8A and 8B illustrate subsequent IMDs 140, 142 that are formed over the second ILD 130. Conductive features 144 are formed therein, such as by a damascene process (e.g., dual damascene process), according to the design of the device.

According to some embodiments, an anneal process and a post-anneal treatment process are performed to improve the device performance. In some embodiments, the anneal process and the post-anneal treatment process are performed any time after the formation of the gate dielectric layer 120. The anneal process and the post-anneal treatment process may improve carrier mobility in the device.

In some embodiments, the anneal process is a high-pressure anneal (HPA) process. The high-pressure anneal process may be performed to introduce atoms of small size to passivate dangling bonds at an interface to reduce interface defects. For example, atoms of small size, such as hydrogen or deuterium, can be introduced to the interfacial region (e.g., the interfacial dielectric 80) between the channel region of the fins 74 and the gate dielectric layer 120 to reduce interface defects and improve carrier mobility in the transistor.

In some embodiments, the high-pressure anneal process is performed in a thermal process chamber, such as furnace for processing multiple substrates, a single substrate process tool, or other suitable tools. In some embodiments, the high-pressure anneal process may be performed in an ambient environment of hydrogen ($H_2$), deuterium ($D_2$), nitrogen ($N_2$), argon (Ar), helium (He), or a combination thereof. The high-pressure anneal process may be performed in a pressure in a range from about 5 atmosphere to about 70 atmosphere. The process temperature may be in a range from about 200° C. to about 700° C. In some embodiments, the process temperature may be in a range from about 350° C. to about 500° C., for example about 400° C. The high-pressure anneal process may be performed for a time duration in a range from about 3 minutes to about 4 hours, for example in a range from about 10 minutes to about 1 hour.

Figure 9:
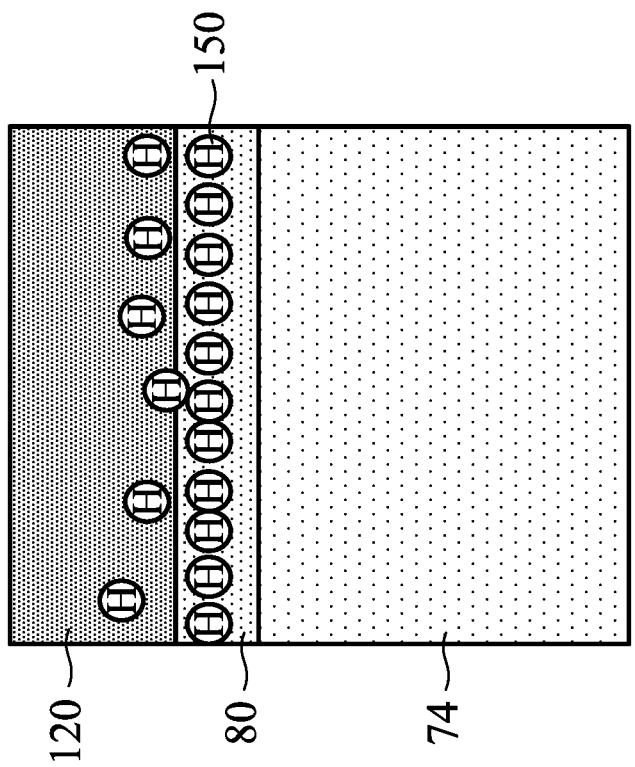
FIG. 9 is a cross-sectional view of a channel region of a transistor device after a high-pressure anneal process in accordance with some embodiments.

FIG. 9 is a cross-sectional view of a portion of the channel region in a fin 74 and the replacement gate structure (e.g., the interfacial dielectric 80 and gate dielectric layer 120) of the transistor device after the high-pressure anneal process in accordance with some embodiments. Hydrogen 150 is introduced to the gate dielectric layer 120 and the interfacial dielectric 80 or the interface between the channel region of the fins 74 and the gate dielectric layer 120.

The channel material in the fins 74 may be or include silicon, germanium, a group IV compound, such as silicon germanium (SiGe), a III-V compound, another semiconductor material, or a combination thereof.

The gate dielectric layer 120 can be, for example a high-k dielectric layer of the FinFET. In some embodiments, the gate dielectric layer 120 may include a high-k dielectric material, such as a metal oxide of or a metal silicate of Hf, Al, Zr, La, Mg, Ba, Ti, Pb, or a combination thereof, silicon oxide ($SiO_2$), silicon oxynitride (SiON), silicon nitride (SiN), or a combination thereof. In some embodiments, the gate dielectric layer 120 may have a thickness in a range from about 1 nm to about 10 nm.

The interfacial dielectric 80 may include a native oxide formed over the channel regions of the fins 74 or a silicon oxide, silicon nitride, or the like formed by thermal growth, chemical growth, or a conformal deposition process, such as ALD, CVD, and the like. In some embodiments, the interfacial dielectric 80 may have a thickness in a range from greater than 0 nm to about 5.0 nm, such as for example, about 1.0 nm.

Hydrogen atoms in the interfacial dielectric 80 and/or an interface between the channel region of the fin 74 and the gate dielectric layer 120 can reduce interface defects and can improve carrier mobility in the transistor. However, hydrogen atoms in the gate dielectric layer 120 or the bulk portion of the gate dielectric layer 120 may cause various problems, such as shifting of threshold voltage (Vt) of the transistor, particularly in P-type transistors.

Measurements show that after the high-pressure anneal process, hydrogen has a higher peak concentration at the interfacial dielectric 80 and lower peak concentration at the bulk gate dielectric layer 120. In a structure where the bulk gate dielectric layer 120 has a thickness of about 10 nm and the interfacial dielectric 80 has a thickness of 2.5 nm, the total amount of hydrogen atoms in the bulk gate dielectric layer 120 is higher than the total amount of hydrogen atoms in the interfacial dielectric 80. In some embodiments, a P-type field-effect transistor has an initial threshold voltage of about 0.7 volt. Hydrogen introduced in the high-pressure anneal may cause the threshold voltage to shift by about 120 mV.

Some embodiments provide a post-anneal treatment process to recover the threshold voltage shift caused by the high-pressure anneal process. In some embodiments, the post-anneal treatment process is a rapid thermal process, laser anneal process, or the like. The post-anneal treatment process reduces the hydrogen atoms in the bulk gate dielectric layer 120 while maintaining the hydrogen concentration in the interfacial dielectric 80.

In some embodiments, the post-anneal treatment process is performed in a thermal process chamber, such as furnace for processing multiple substrates, a single substrate process tool, or other suitable tools, such as laser anneal tools. In some embodiments, the high-pressure anneal process and post-anneal treatment process may be performed back to back in the same tool.

The post-anneal treatment process may be performed in an ambient environment including one or more of nitrogen ($N_2$), argon (Ar), helium (He), hydrogen ($H_2$), deuterium ($D_2$), or a combination thereof. The composition of the ambient environment may be determined by the hydrogen amount in the bulk gate dielectric layer 120 and the interfacial dielectric 80 prior to the process. For example, the ambient environment may include nitrogen ($N_2$), argon (Ar), helium (He), or a combination, but without hydrogen ($H_2$) or deuterium ($D_2$) to reduce the hydrogen concentration in the bulk gate dielectric layer 120. For example, the ambient environment includes nitrogen. In another embodiment, the ambient environment may include nitrogen ($N_2$), argon (Ar), helium (He), or a combination and with some hydrogen ($H_2$)

or deuterium ($D_2$) to maintain the hydrogen concentration in the interfacial dielectric 80. In some examples, the composition of an ambient environment may be adjusted, for example by increasing or decreasing the ratio of $H_2$ or $D_2$ during the process to achieve a target effect, such as to achieve a hydrogen concentration level in the interfacial dielectric 80. In some embodiments, the ratio of $H_2$ or $D_2$ in the processing gas to a total of the processing gas is in a range from about 0 by flow volume to about 100 by flow volume.

In some embodiments, the post-anneal treatment process is performed in a range from about 1 mTorr to about 5 atmosphere. In some embodiments, the post-anneal treatment process is performed in a low pressure, for example in a range from 1 Torr to 10 Torr. In some embodiments, the post-anneal treatment process may be performed in normal atmosphere, such as 1 atmosphere. In some embodiment, the post-anneal treatment process may be performed in a high-pressure, such as in a range from 1 atmosphere to 5 atmosphere.

In some embodiments, the process temperature for the post-anneal treatment process is in a range from about 200° C. to about 700° C. If the process temperature is too low, atoms, such as hydrogen atoms, may not be able to obtain sufficient kinetic energy to move in the dielectric layers. If the process temperature is too high, some layers in the substrate may melt or incur undesired physical or chemical reactions. In some embodiments, the process temperature may be in a range from about 350° C. to about 500° C., for example about 400° C.

The post-anneal treatment process may be performed for a time duration in a range from about 5 minutes to about 150 minutes. In some embodiments, the post-anneal treatment process is performed for a time duration in a range from about 10 minutes to about 90 minutes. In some embodiments, the time duration of the post-anneal treatment process can be sufficiently long to keep hydrogen at an interface between the channel region and the gate dielectric layer 120 (e.g., in the interfacial dielectric 80) while removing hydrogen from the bulk portion of the gate dielectric layer 120.

Figure 10:
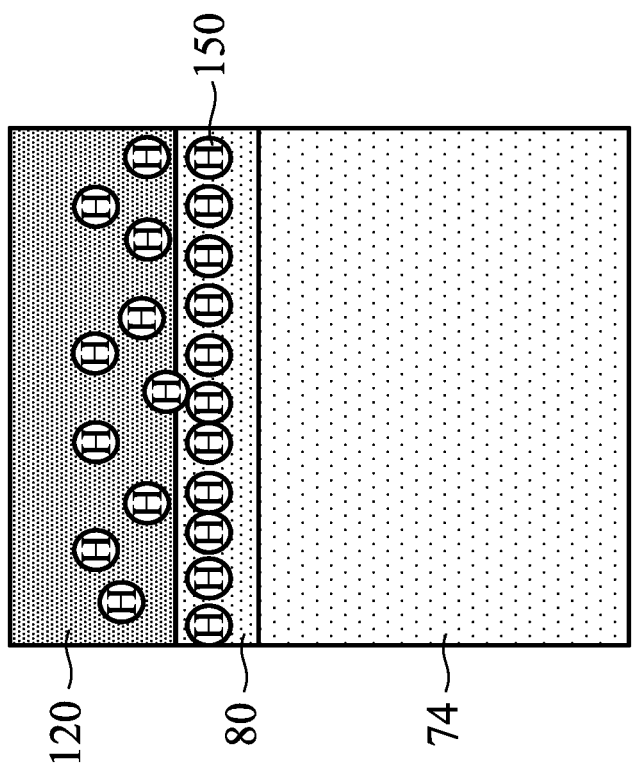
FIG. 10 is a cross-sectional view of the channel region of the transistor device after a post-anneal treatment process in accordance with some embodiments.

FIG. 10 is a cross-sectional view of the portion of the channel region and replacement gate structure of the transistor device after the post-anneal treatment process in accordance with some embodiments. Measurement shows that after the post-anneal treatment process, hydrogen remains at a higher peak concentration at the interfacial dielectric 80 and at a lower peak concentration at the bulk gate dielectric layer 120. However, the total amounts of hydrogen atoms in the interfacial dielectric 80 and the bulk gate dielectric layer 120 are substantially equal. In some embodiments, the total amount of hydrogen atoms in the bulk gate dielectric layer 120 is lower than the total amount of hydrogen atoms in the interfacial dielectric 80. The threshold voltage shift is within a range from about 10 mV to about 20 mV, in some instances. In some embodiments, the initial threshold voltage before the high pressure anneal process is about 0.7 volt. The final threshold voltage shift after the post-anneal treatment process may be in a range from about 1.4% to about 2.9% of the initial threshold voltage.

In some embodiments, the anneal process and the post-anneal treatment process reduce peak hydrogen concentration and total hydrogen in the bulk gate dielectric layer 120 and the interfacial dielectric 80. In some embodiments, the anneal process and the post-anneal treatment process increase the ratios of peak concentrations and total hydrogen counts in the interfacial dielectric 80 and in the bulk gate dielectric layer 120. In some embodiments, after the anneal process and post-anneal treatment process are performed, the ratio of a peak concentration of hydrogen in the interfacial dielectric 80 to a peak concentration of hydrogen in the bulk gate dielectric layer 120 is in a range from about 0.1 to about 5, for example about 2.7. In some embodiments, the ratio of a peak concentration of hydrogen in the interfacial dielectric 80 to a peak concentration of hydrogen in the bulk gate dielectric layer 120 is greater than 2.5, such as in a range from greater than 2.5 to about 5. In some embodiments, the ratio of a peak concentration of hydrogen in the interfacial dielectric 80 to a peak concentration of hydrogen in the bulk gate dielectric layer 120 is greater than or equal to about 2.7, such as in a range from about 2.7 to about 5. In some embodiments, after the anneal process and post-anneal treatment process are performed, the ratio of total hydrogen counts in the interfacial dielectric 80 and in the bulk gate dielectric layer 120 is in a range from about 0.1 to about 2, for example about 1.0.

Figure 11:
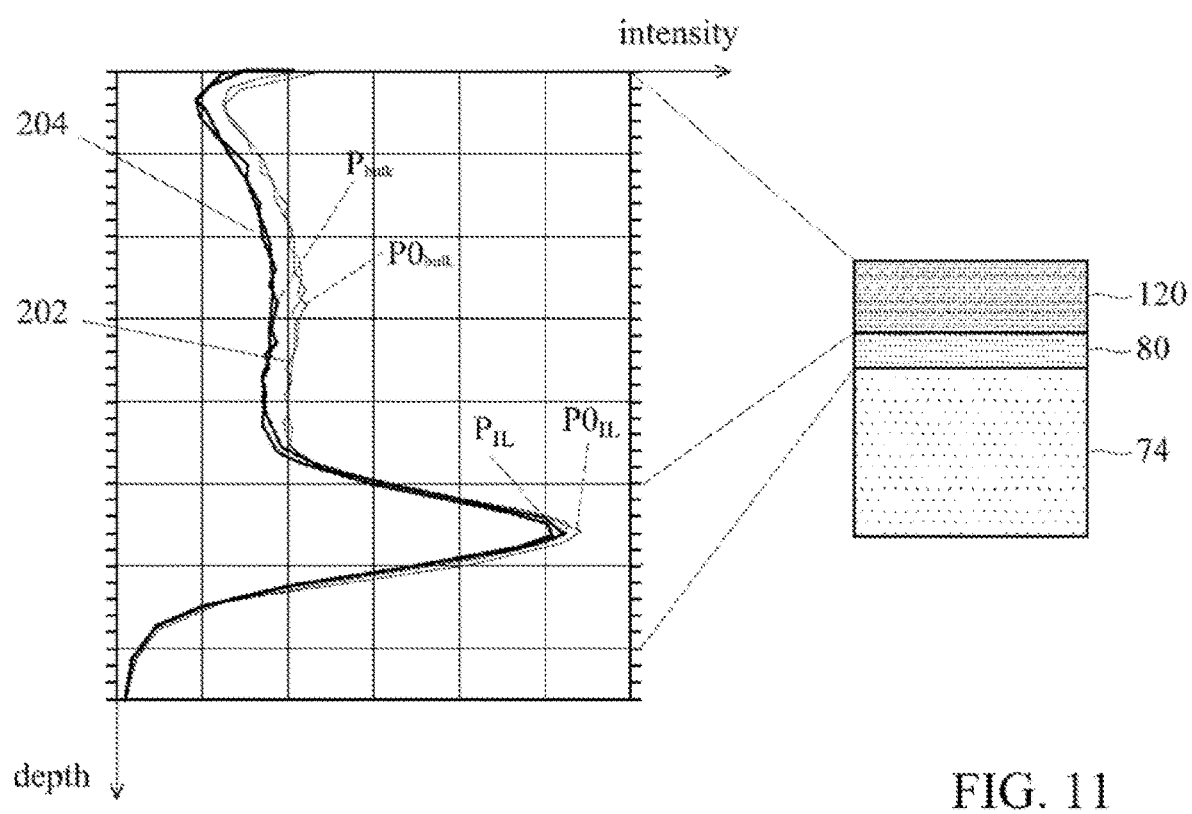
FIG. 11 includes example hydrogen concentration profiles in devices formed with and without an example post-anneal treatment process in accordance with some embodiments.

FIG. 11 includes example hydrogen concentration profiles in devices with and without the post-anneal treatment process. The profile 202 demonstrates a hydrogen concentration profile in the bulk gate dielectric layer 120 and the interfacial dielectric 80 without performing the anneal process and the post-anneal treatment process described above. The profile 204 demonstrates a hydrogen concentration profile in the bulk gate dielectric layer 120 and the interfacial dielectric 80 after performing the anneal process and the post-anneal treatment process described above.

The concentration value $Po_{bulk}$ indicates a peak concentration in the bulk gate dielectric layer 120 in the profile 202. The concentration value $Po_{IL}$ indicates a peak concentration in the interfacial dielectric 80 in the profile 202. The concentration value $P_{bulk}$ indicates a peak concentration in the bulk gate dielectric layer 120 in the profile 204. The concentration value $P_{IL}$ indicates a peak concentration in the interfacial dielectric 80 in the profile 204. In the example of FIG. 11, when the anneal process and post-anneal treatment process are not performed, the ratio of peak concentrations in the interfacial dielectric 80 and in the bulk gate dielectric layer 120 ($Po_{IL}:Po_{bulk}$) is about 2.5; when the anneal process and post-anneal treatment process are performed, the ratio of peak concentrations in the interfacial dielectric 80 and in the bulk gate dielectric layer 120 ($P_{IL}:P_{bulk}$) is about 2.7. The ratio of peak concentrations in the interfacial dielectric 80 and in the bulk gate dielectric layer 120 increases by about 8.0% when the anneal process and post-anneal treatment process are performed.

In the example shown in FIG. 11, the total hydrogen atoms in the gate dielectric layer 120 and in the interfacial dielectric 80 are about $1.13 \times 10^5$ count and about $9.95 \times 10^4$, respectively, when the anneal process and the post-anneal treatment process are not performed. The total hydrogen atoms in the gate dielectric layer 120 and in the interfacial dielectric 80 are about $1.04 \times 10^5$ count and about $9.63 \times 10^4$, respectively, when the anneal process and the post-anneal treatment process are performed. In the example of FIG. 11, when the anneal process and post-anneal treatment process are not performed, the ratio of total hydrogen in the interfacial dielectric 80 and in the bulk gate dielectric layer 120 is about 0.88, and when the anneal process and post-anneal treatment process are performed, the ratio of total hydrogen in the interfacial dielectric 80 and in the bulk gate dielectric layer 120 is about 1.0. The ratio of total hydrogen counts in the interfacial dielectric 80 and in the bulk gate dielectric layer 120 increases by about 13.7% when the anneal process and post-anneal treatment process are performed.

The inventors have observed that the increased ratio of total hydrogen counts or peak concentrations in the interfacial dielectric 80 and the bulk gate dielectric layer 120 reduces threshold voltage shift caused by the high-pressure anneal process.

Referring to FIG. 8A, the bulk gate dielectric layer 120 covers the interfacial dielectric 80 and sidewalls of the spacers 86. In some embodiments, the hydrogen concentration within the bulk gate dielectric layer 120 decreases in a direction away from the interfacial dielectric 80. Accordingly, the hydrogen concentration in the bulk gate dielectric layer 120 is higher at the portion near a bottom of the spacer 86 (near the epitaxy source/drain regions 92) than at the portion near the second ILD 130.

In some embodiments, the anneal process and the post-anneal treatment process may be performed after conductive features are completed in the top most IMD, as shown in FIGS. 8A and 8B. In another embodiment, the anneal process and the post-anneal treatment process are performed after the formation of the gate dielectric layer 120, as shown in FIGS. 5A and 5B, and before forming the one or more conformal layers 121 and conductive fill material 122. In another embodiment, the anneal process and the post-anneal treatment process may be performed after the replacement gate structures are completed, as shown in FIGS. 6A and 6B. In another embodiment, the anneal process and the post-anneal treatment process may be performed after formation of the conductive features in the second ILD 130 as shown in FIGS. 7A and 7B. The anneal process and the post-anneal treatment process may be performed back to back, for example, performed back to back in the same process chamber. In some examples, the anneal process and the post-anneal treatment process may be performed separately at suitable time.

Some embodiments provide a thermal treatment process following a high-pressure anneal process to keep hydrogen at interface between a channel region and a gate dielectric layer in a field effect transistor while removing hydrogen from the bulk portion of the gate dielectric layer. The thermal treatment process can reduce the amount of threshold voltage shift caused by a high-pressure anneal. The high-pressure anneal and the thermal treatment process may be performed at any time after formation of the gate dielectric layer, thus, causing no disruption of the existing process flow.

One embodiment provides a method comprising performing a high pressure anneal process to a structure having a conformal dielectric layer formed over a channel region of an active area to introduce hydrogen to an interface between the conformal dielectric layer and the channel region, and after performing the high-pressure anneal process, performing a post-anneal treatment to reduce hydrogen in the conformal dielectric layer.

Another embodiment provides a structure. The structure includes an active area on a substrate. The active area has a channel region. The structure further includes a gate structure over the channel region of the active area. The gate structure includes an interfacial layer over the active area, a conformal dielectric layer over the interfacial layer, and a gate electrode layer over the interfacial layer. A ratio of a peak concentration of hydrogen in the interfacial layer to a peak concentration of hydrogen in the conformal dielectric layer is in a range from about 0.1 to about 5.

Yet another embodiment provides a method comprising forming an active area on a substrate, wherein the active area has a channel region, forming a dummy gate structure over the channel region of the active area, removing the dummy gate structure to expose the channel region of the active area, forming an interfacial layer over the channel region of the active area, forming a conformal dielectric layer over the interfacial layer, performing a high pressure anneal process to introduce hydrogen to the interfacial layer, and after performing the high-pressure anneal process, performing a post-anneal treatment to reduce hydrogen in the conformal dielectric layer.

Yet another embodiment provides a method comprising forming a gate structure over a channel region of an active area, wherein the gate structure includes a conformal dielectric layer over the active area, annealing the gate structure at a first pressure to introduce hydrogen to an interface between the conformal dielectric layer and the channel region, and performing a post-anneal treatment on the gate structure at a second pressure to reduce hydrogen in the conformal dielectric layer, wherein the first pressure is higher than the second pressure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming a first dielectric layer over a substrate;
   forming a second dielectric layer over the first dielectric layer;
   after forming the first dielectric layer and the second dielectric layer, introducing hydrogen to the first dielectric layer;
   after introducing hydrogen, driving hydrogen from the second dielectric layer into the first dielectric layer; and
   after driving the hydrogen, forming conductive element over the second dielectric layer.

2. The method of claim 1, wherein introducing hydrogen is performed at least in part by a first anneal process performed in a first ambient, wherein the first ambient comprises hydrogen or deuterium.

3. The method of claim 1, wherein introducing hydrogen comprises passivating dangling bonds at an interface between the first dielectric layer and the second dielectric layer.

4. The method of claim 1, wherein introducing hydrogen comprises performing a first anneal, wherein driving the hydrogen comprises a second anneal, wherein the first anneal is a different anneal process than the second anneal.

5. The method of claim 4, wherein the second anneal is performed at a lower pressure than the first anneal.

6. The method of claim 4, wherein the first anneal comprises a high pressure anneal process is performed at a pressure in a range from 5 atmosphere to 70 atmosphere.

7. The method of claim 4, wherein the first anneal is performed in a first ambient, wherein the second anneal is performed in a second ambient, wherein the first ambient is different than the second ambient.

8. The method of claim 7, wherein the second ambient has less hydrogen than the first ambient.

9. A method, comprising:
forming a dielectric structure over a substrate, wherein the dielectric structure includes a first dielectric layer over the substrate and a second dielectric layer over the first dielectric layer;
annealing the dielectric structure at a first pressure to introduce hydrogen to an interface between the first dielectric layer and the second dielectric layer;
performing a post-anneal treatment on the dielectric structure at a second pressure to reduce hydrogen in the second dielectric layer, wherein the first pressure is higher than the second pressure; and
after performing the post-anneal treatment, forming a conductive feature over the second dielectric layer.

10. The method of claim 9, wherein the first pressure is in a range from about 5 atmosphere to about 70 atmosphere, and the second pressure is in a range from about 1 mTorr to about 5 atmosphere.

11. The method of claim 9, wherein annealing the dielectric structure is performed in a first ambient, wherein the post-anneal treatment is performed in a second ambient, wherein the second ambient comprises less hydrogen than the first ambient.

12. The method of claim 11, wherein the second ambient comprises nitrogen, argon, helium, hydrogen, deuterium, or a combination thereof.

13. The method of claim 9, wherein the conductive feature is a gate electrode.

14. The method of claim 9, wherein after performing the post-anneal treatment, a peak concentration of hydrogen in the first dielectric layer is greater than a peak concentration of hydrogen in the second dielectric layer.

15. A method comprising:
performing a high-pressure anneal process to a structure having a first dielectric layer formed over a substrate and a second dielectric layer formed over the first dielectric layer, the high-pressure anneal process introducing hydrogen near an interface between the first dielectric layer and substrate;
after performing the high-pressure anneal process, performing a post-anneal treatment to reduce hydrogen in the second dielectric layer; and
after performing the post-anneal treatment, forming a conductive feature over the second dielectric layer.

16. The method of claim 15, wherein the post-anneal treatment is performed in a first ambient, the first ambient comprising hydrogen.

17. The method of claim 16, wherein the high-pressure anneal process is performed in a second ambient, wherein the first ambient has a lower concentration of hydrogen than the second ambient.

18. The method of claim 15, wherein the post-anneal treatment is performed in a first ambient, wherein the first ambient is free of hydrogen.

19. The method of claim 15, wherein after performing the post-anneal treatment, a peak concentration of hydrogen in the second dielectric layer is at an interface between the first dielectric layer and the second dielectric layer.

20. The method of claim 15, wherein after performing the post-anneal treatment, a peak concentration of hydrogen in the first dielectric layer is greater than a peak concentration of hydrogen in the second dielectric layer.

* * * * *